(12) United States Patent
Surisetty et al.

(10) Patent No.: US 9,972,620 B2
(45) Date of Patent: May 15, 2018

(54) PREVENTING SHORTING BETWEEN SOURCE AND/OR DRAIN CONTACTS AND GATE

(71) Applicant: GLOBALFOUNDRIES Inc., Grand Cayman (KY)

(72) Inventors: Charan V. Surisetty, Clifton Park, NY (US); Dominic J. Schepis, Wappingers Falls, NY (US); Kangguo Cheng, Schenectady, NY (US); Alexander Reznicek, Rensselaer, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 63 days.

(21) Appl. No.: 15/234,762

(22) Filed: Aug. 11, 2016

(65) Prior Publication Data

US 2018/0047727 A1 Feb. 15, 2018

(51) Int. Cl.
| | |
|---|---|
| *H01L 21/28* | (2006.01) |
| *H01L 27/088* | (2006.01) |
| *H01L 21/8234* | (2006.01) |
| *H01L 21/3105* | (2006.01) |
| *H01L 29/417* | (2006.01) |

(52) U.S. Cl.
CPC .... *H01L 27/0886* (2013.01); *H01L 21/31053* (2013.01); *H01L 21/823431* (2013.01); *H01L 21/823437* (2013.01); *H01L 21/823475* (2013.01); *H01L 29/41791* (2013.01)

(58) Field of Classification Search
CPC .. H01L 29/41791; H01L 29/66795–29/66818; H01L 29/785–29/7856; H01L 2029/7857; H01L 2029/7858; H01L 21/823431; H01L 21/823821; H01L 21/845; H01L 27/0886; H01L 27/0924; H01L 27/1211
See application file for complete search history.

(56) References Cited

U.S. PATENT DOCUMENTS

| | | | |
|---|---|---|---|
| 9,147,748 B1* | 9/2015 | Xie | H01L 29/66545 |
| 2013/0043592 A1* | 2/2013 | Park | H01L 29/4966 257/754 |
| 2014/0070282 A1* | 3/2014 | Fan | H01L 21/28088 257/288 |
| 2017/0047422 A1* | 2/2017 | Lin | H01L 29/6656 |
| 2017/0053804 A1* | 2/2017 | Lu | H01L 21/28132 |

* cited by examiner

*Primary Examiner* — Eric Ward
(74) *Attorney, Agent, or Firm* — Wayne F. Reinke, Esq.; Heslin Rothenberg Farley & Mesiti P.C.

(57) ABSTRACT

Electrical shorting between source and/or drain contacts and a conductive gate of a FinFET-based semiconductor structure are prevented by forming the source and drain contacts in two parts, a bottom contact part extending up to a height of the gate cap and an upper contact part situated on at least part of the bottom contact part.

3 Claims, 9 Drawing Sheets

PREVENTING SHORTING BETWEEN SOURCE AND/OR DRAIN CONTACTS AND GATE

BACKGROUND

Technical Field

The present invention generally relates to fabrication of semiconductor structures. More particularly, the present invention relates to preventing electrical shorting between source and/or drain contacts and their associated gate in a FinFET-based semiconductor device.

Background Information

In modern FinFET-based semiconductor fabrication, self-aligned contacts have been used to accommodate the ever-shrinking size of such devices. However, such self-aligned contacts suffer from insufficient spacer-to-spacer distance for contact formation. In addition, variations in the resulting gate cap size leads to electrical shorting between the conductive gate and source and drain contacts.

SUMMARY

Thus, a need continues to exist for preventing electrical shorts between conductive gates and source and drain contacts of FinFET-based semiconductor devices.

The shortcomings of the prior art are overcome and additional advantages are provided through the provision, in one aspect, of a method of preventing electrical contact between a gate and source and drain contacts. The method includes providing a semiconductor structure, the semiconductor structure including a semiconductor substrate, one or more fins on the substrate, at least one fin of the one or more fins comprising a source, a drain, and a channel situated between the source and the drain The method further includes forming a gate structure having a gate electrode surrounding the channel and a thick gate cap on top of the gate electrode, and two spacers adjacent to sidewalls of the gate electrode and the thick gate cap. The method further includes forming lower contacts over the source and the drain adjacent to the gate structures, and forming upper contacts for the source and the drain over at least part of the respective lower contacts.

In accordance with another aspect, a method of forming at least one FinFET is provided. The method includes forming a gate structure, the gate structure surrounding a channel of the at least one FinFET, the gate structure including a conductive gate electrode, spacers adjacent to sidewalls of the metal gate electrode, and a thick gate cap having a thickness of between about 30 nm and about 50 nm. The method further includes forming a source and a drain, the channel being situated between the source and the drain, forming two-part conductive contacts for the source and the drain, each of the conductive contacts having a bottom part adjacent the thick gate cap and a top part above and in at least partial contact with the bottom part. A combination of the thick gate cap and the two-part source and drain contacts prevent electrical shorts between the conductive gate electrode and the source and the drain.

In accordance with yet another aspect, a semiconductor structure is provided. The semiconductor structure includes a semiconductor substrate, at least one fin on the substrate, at least one conductive gate surrounding a portion of the at least one fin, at least one pair of spacers along sidewalls of the at least one conductive gate, at least one gate cap on the at least one conductive gate, and at least one source and at least one drain adjacent each of the at least one pair of spacers, respectively. The semiconductor structure further includes at least one lower contact above the at least one source and the at least one drain, and at least one upper contact above at least part of the at least one source and the at least one drain.

These, and other objects, features and advantages of this invention will become apparent from the following detailed description of the various aspects of the invention taken in conjunction with the accompanying drawings.

DETAILED DESCRIPTION OF THE EMBODIMENTS

Figure 1:
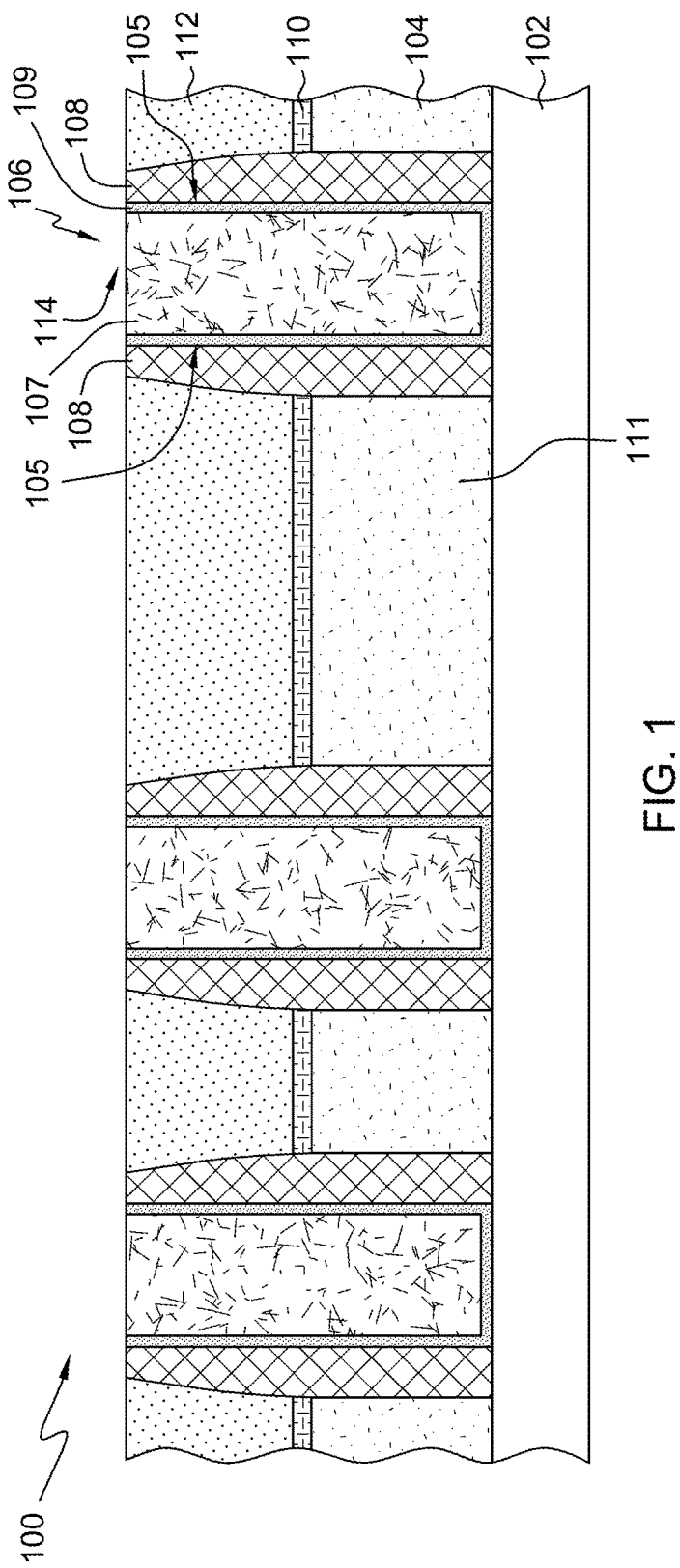
FIG. 1 is a simplified cross-sectional view (the gate structure below the liner is actually behind the fin) of one example of a starting semiconductor structure (here, a FinFET in fabrication), the structure including a semiconductor substrate, one or more fins coupled to the substrate and surrounded at one or more locations by a gate electrode and corresponding spacers, the gate electrode lined with a gate liner (e.g., tantalum nitride), and the one or more fins also having a liner thereover, over which is dielectric material, up to a top exposed planarized surface of the gate structure(s) and spacers, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value. Also, as used herein, the term "source/drain" means source or drain, where sources and drains are processed similarly.

The present invention solves the electrical shorting problem between the gate electrode of a FinFET-based device and a source and/or drain contact, caused by variations in gate cap heights, by effectively forming the source and drain contacts in two sections, a bottom portion of the source and drain contacts up to a height of the gate cap and an upper portion of the source and drain contacts starting at the gate cap.

Reference is made below to the drawings, which are not drawn to scale for ease of understanding, wherein the same reference numbers are used throughout different figures to designate the same or similar components.

FIG. 1 is a simplified cross-sectional view (the gate structure below the liner is actually behind the fin) of one example of a starting semiconductor structure 100 (here, a FinFET in fabrication), the structure including a semiconductor substrate 102, one or more fins on the substrate (e.g., fin 104), source/drain regions (e.g., source/drain 111), the fin(s) surrounded at one or more locations by one or more gate electrodes (e.g., gate electrode 107) with corresponding spacers (e.g., spacers 108), the spacers being adjacent to sidewalls 105 of the gate(s), a liner 109 (e.g., tantalum nitride) for the gate electrode separating the gate electrode from the spacers and substrate, the fin(s) having a liner thereover (e.g., liner 110), a dielectric layer 112 (e.g., silicon dioxide) over the liner, the dielectric layer extending up to a top exposed planarized surface of the gate(s) and spacers, in accordance with one or more aspects of the present invention.

The starting structure may be conventionally fabricated, for example, using known processes and techniques. However, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
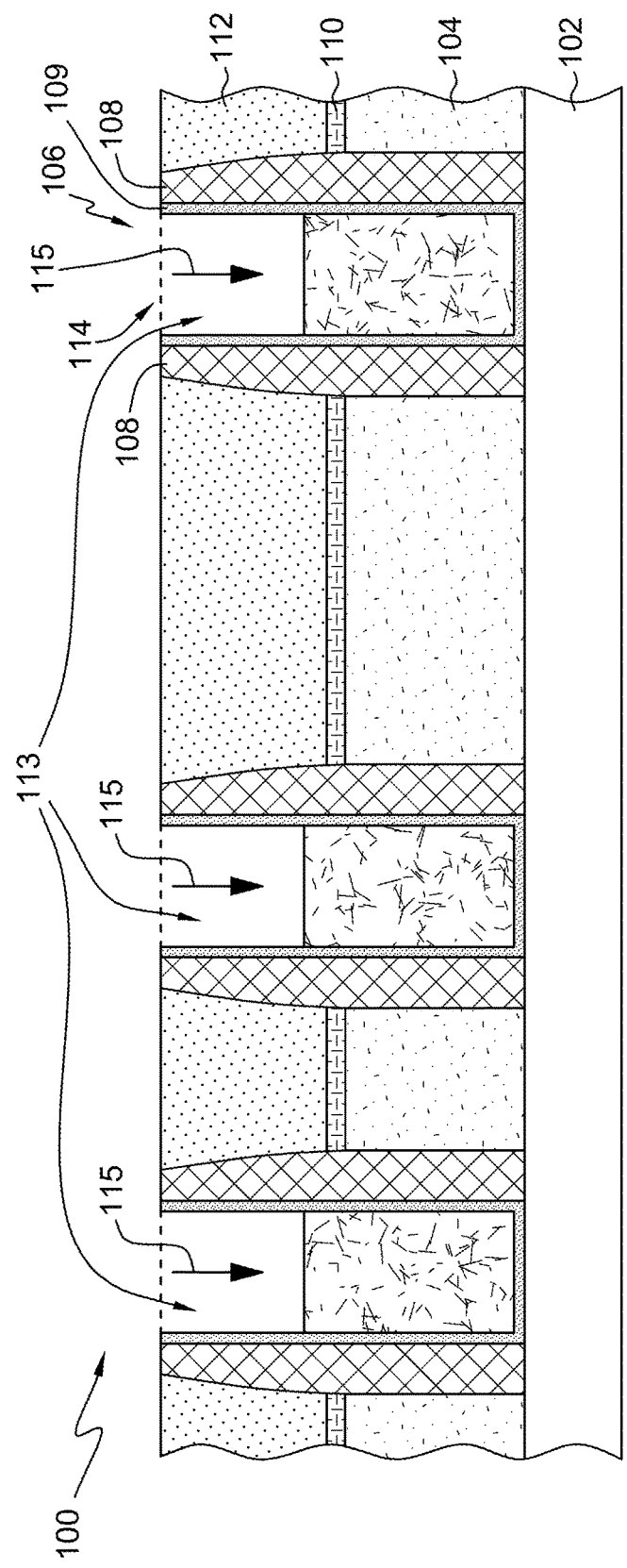
FIG. 2 depicts one example of the structure of FIG. 1 after recessing the gate structure(s), in accordance with one or more aspects of the present invention.

FIG. 2 depicts one example of the semiconductor structure 100 of FIG. 1 after portions of the gate electrodes are removed by recessing 115 the gate electrodes in contemplation of gate caps. Recessing the gates also creates gate openings 113. The conductive gate may be, for example, tungsten silicide. These materials can be etched using, for example, a $Cl_2/O_2$ plasma etch or reactive ion etch. The gate can also be recessed using a well controlled wet etch, such as, for example, an aqueous solution of $NH_4OH/H_2O_2$ at a temperature of about 25 degrees Celsius or higher.

Figure 3:
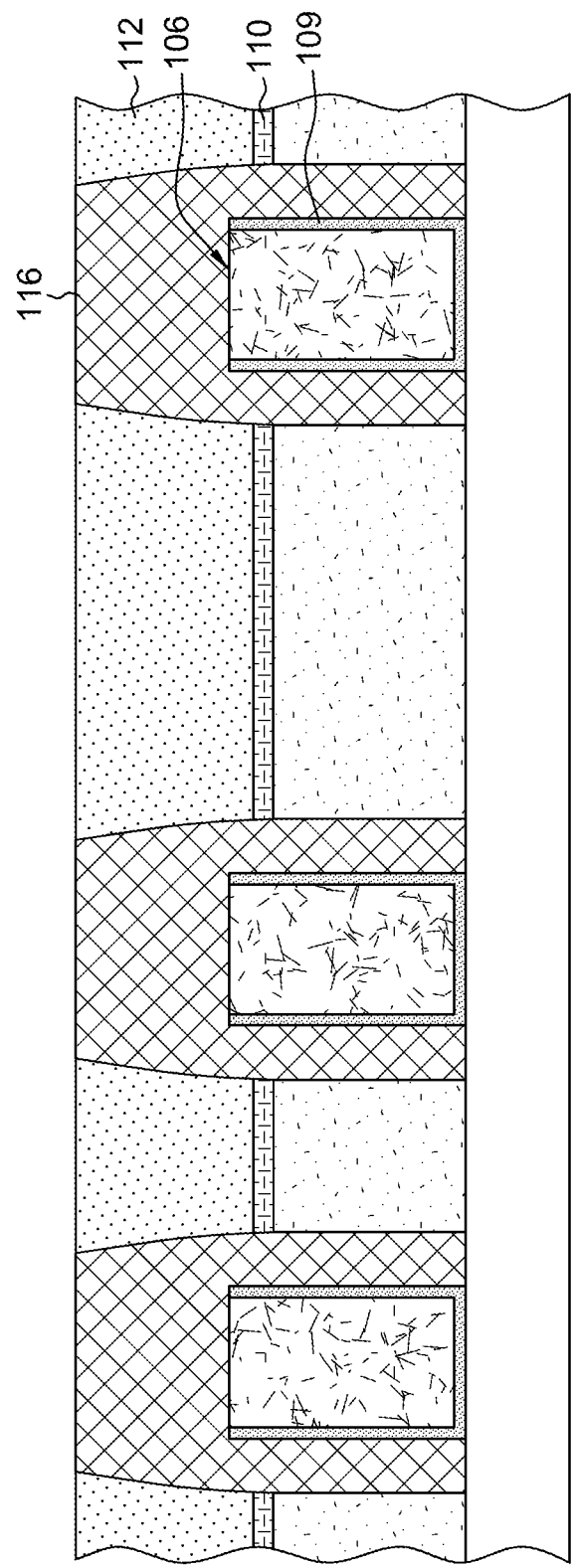
FIG. 3 depicts one example of the structure of FIG. 2 after recessing the liner down to a top surface of the gate electrodes and forming relatively thick gate cap(s) in the gate openings, in accordance with one or more aspects of the present invention.

FIG. 3 depicts one example of the structure of FIG. 2 after recessing liner 109 down to a top surface of the gate electrodes and forming relatively thick gate cap(s) (e.g., gate cap 116) in the gate openings 113, which may be, for example, of a same hard mask material as the spacers (e.g., SiN) and may be formed by, for example, deposition of hard mask material followed by planarization (e.g., chemical-mechanical polish) thereof, which helps ensure the gate cap is thick enough to prevent unintended intrusion during subsequent fabrication processes, in accordance with one or more aspects of the present invention.

The liner for the gate is usually made with conventional work-function metals such as titanium nitride (TiN). To remove this TiN gate outside liner on the top of the structure in FIG. 3, a wet etch such as $H_2SO_4/H_2O_2$ (sulfuric acid/hydrogen peroxide) at or about 25 degrees Celsius would be used.

Figure 4:
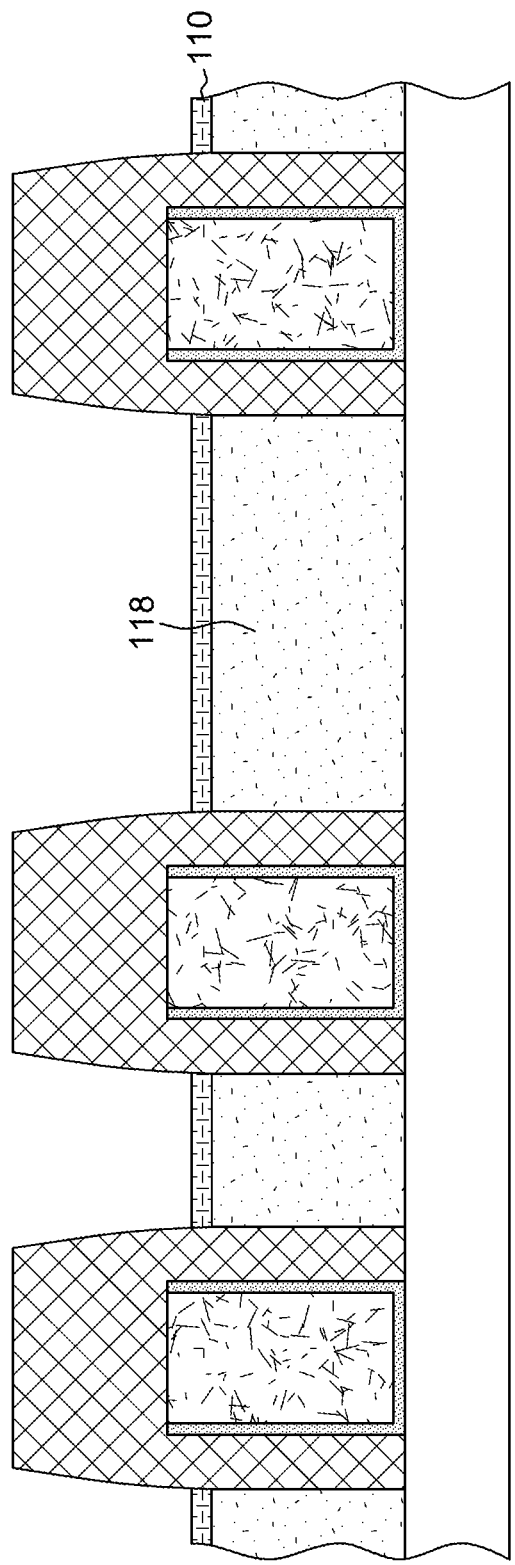
FIG. 4 depicts one example of the structure of FIG. 3 after removing the dielectric layer selective to the liner, for example, using wet or dry etches, exposing the source(s) and drain(s), in accordance with one or more aspects of the present invention.

FIG. 4 depicts one example of the structure of FIG. 3 after removing the dielectric layer 112 selective to liner 110, for example, using wet or dry etches, in accordance with one or more aspects of the present invention.

Figure 5:
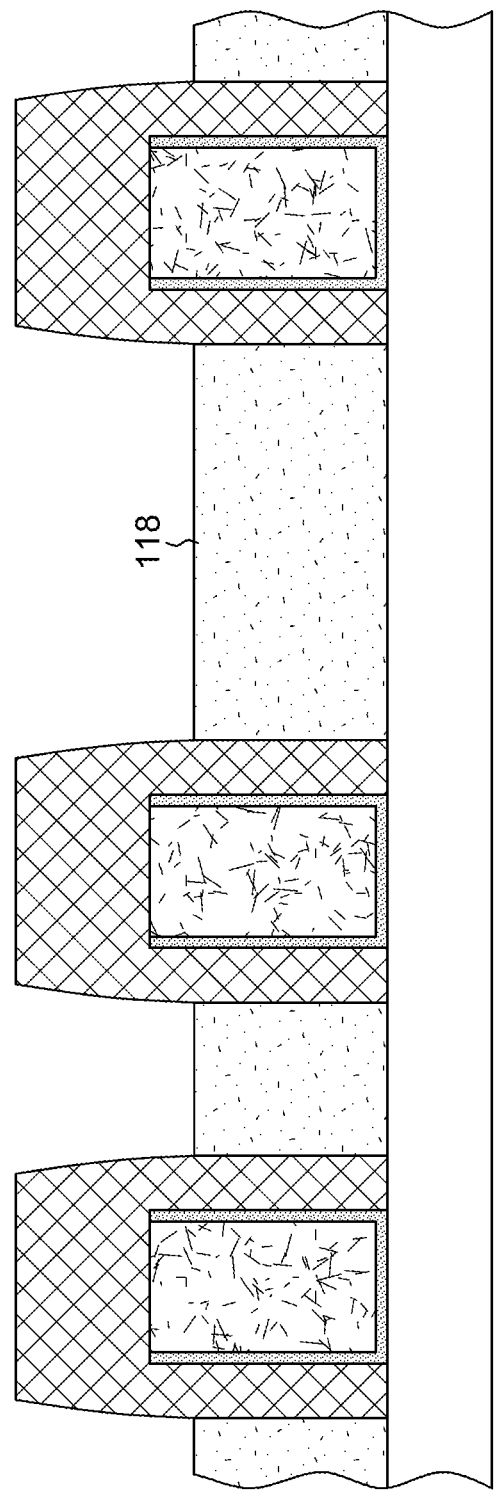
FIG. 5 depicts one example of the structure of FIG. 4 after removal of the liner, in accordance with one or more aspects of the present invention.

FIG. 5 depicts one example of the structure of FIG. 4 after removal of the liner 110, for example, using a reactive ion etching process. Removal of the liner also exposes the sources and drains (e.g., source/drain 118), in accordance with one or more aspects of the present invention.

Figure 6:
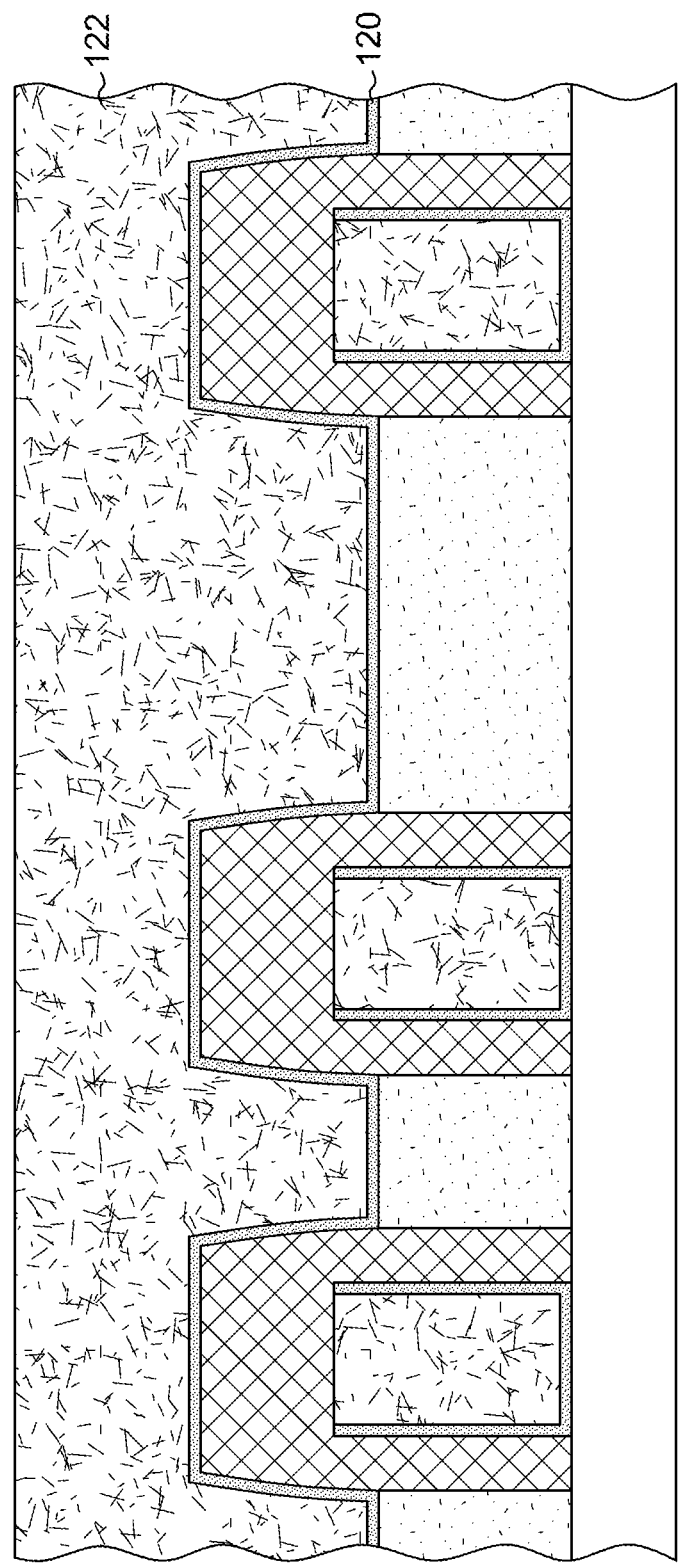
FIG. 6 depicts one example of the structure of FIG. 5 after forming a blanket conformal liner (e.g., titanium nitride or silicide) over the structure and blanket filling over the liner with conductive material (e.g., tungsten), in accordance with one or more aspects of the present invention.

FIG. 6 depicts one example of the structure of FIG. 5 after forming a blanket conformal liner 120 (e.g., titanium nitride or silicide) over the structure, blanket filling over the liner with one or more conductive materials 122 (e.g., tungsten), and planarizing the conductive material(s) to a point above the gate caps, in accordance with one or more aspects of the present invention.

The liner 120 in FIG. 6 should be conformal, since it will have to fill in areas between closely spaced gates. It does not have to be perfectly conformal, but most films deposited using atomic layer deposition (ALD) will be conformal. CVD films may also be sufficient if the spacing and aspect ratio permits.

It is common to have a liner for many metallic films for two reasons. First, the metal films such as tungsten and copper, for example, will not nucleate on materials such as silicon or SiO2. To get a void free fill of narrow areas will require good nucleation which will occur if an appropriate liner is used. Second, metals such as tungsten, for example, which was used as one possible material for conductor 122 in FIG. 6, is formed by the reduction of tungsten hexafluoride (WF6) with hydrogen (H2). The F2 byproduct that is produced during deposition would etch the underlying silicon layers if no liner 120 was present.

Figure 7:
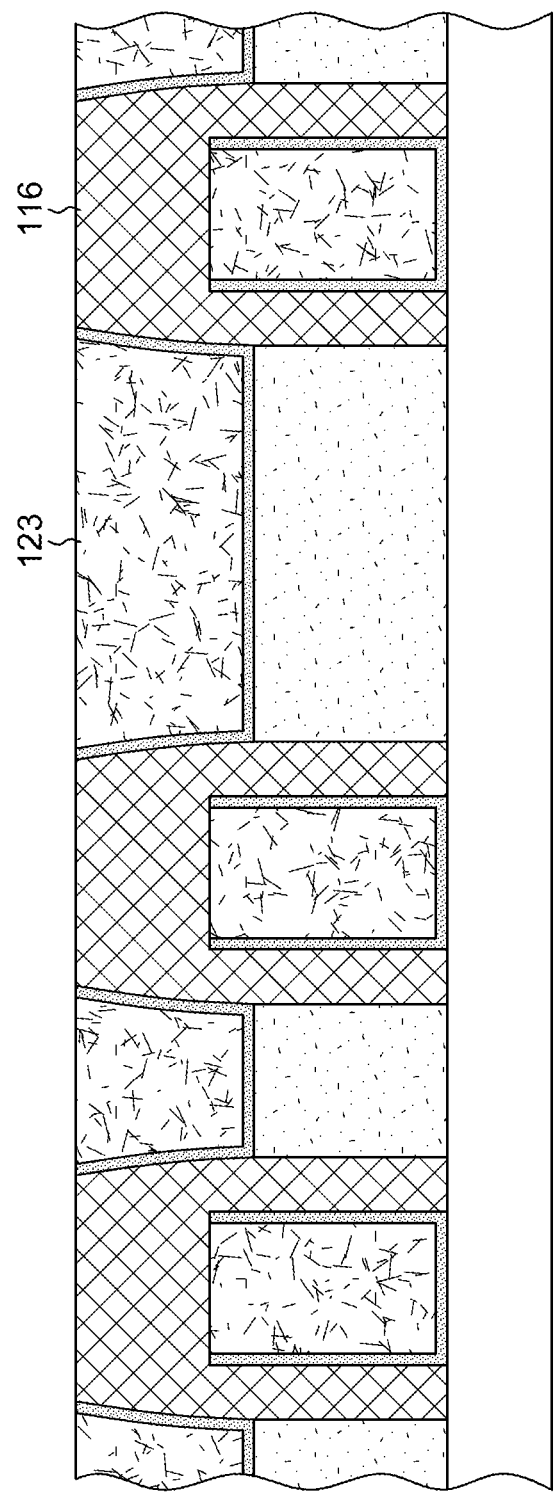
FIG. 7 depicts one example of the structure of FIG. 6 after planarizing down to the gate cap(s), for example, using a chemical-mechanical polishing (CMP) process, resulting in lower contact(s) to the source(s) and drain(s), in accordance with one or more aspects of the present invention.

FIG. 7 depicts one example of the structure of FIG. 6 after planarizing down to the gate cap(s) (e.g., gate cap 116), for example, using a chemical-mechanical polishing (CMP) process. In that case, the gate cap(s) would serve as a stop. Planarizing also results in forming lower source/drain contacts (e.g., lower source/drain contact 123), in accordance with one or more aspects of the present invention.

Figure 8:
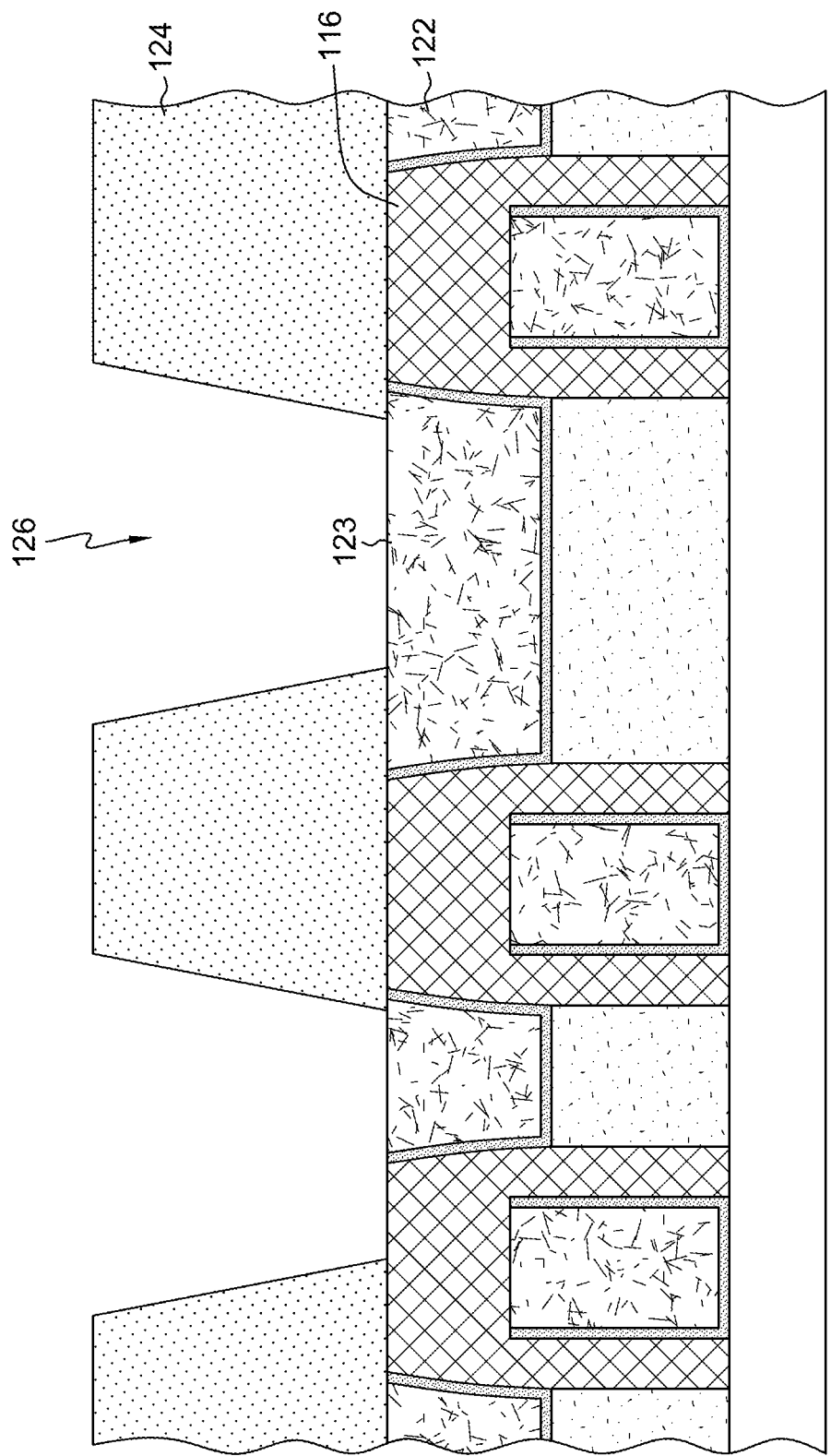
FIG. 8 depicts one example of the structure of FIG. 7 after forming a blanket dielectric layer over the planarized surface of the structure, and forming an upper contact trench in the blanket dielectric layer for each lower contact, in accordance with one or more aspects of the present invention.

FIG. 8 depicts one example of the structure of FIG. 7 after forming a blanket dielectric layer 124 over the planarized surface of the structure, and forming upper contact openings, exposing at least part of the contacts. For example, contact opening 126 exposes part of lower source/drain contact 123, in accordance with one or more aspects of the present invention.

Figure 9:
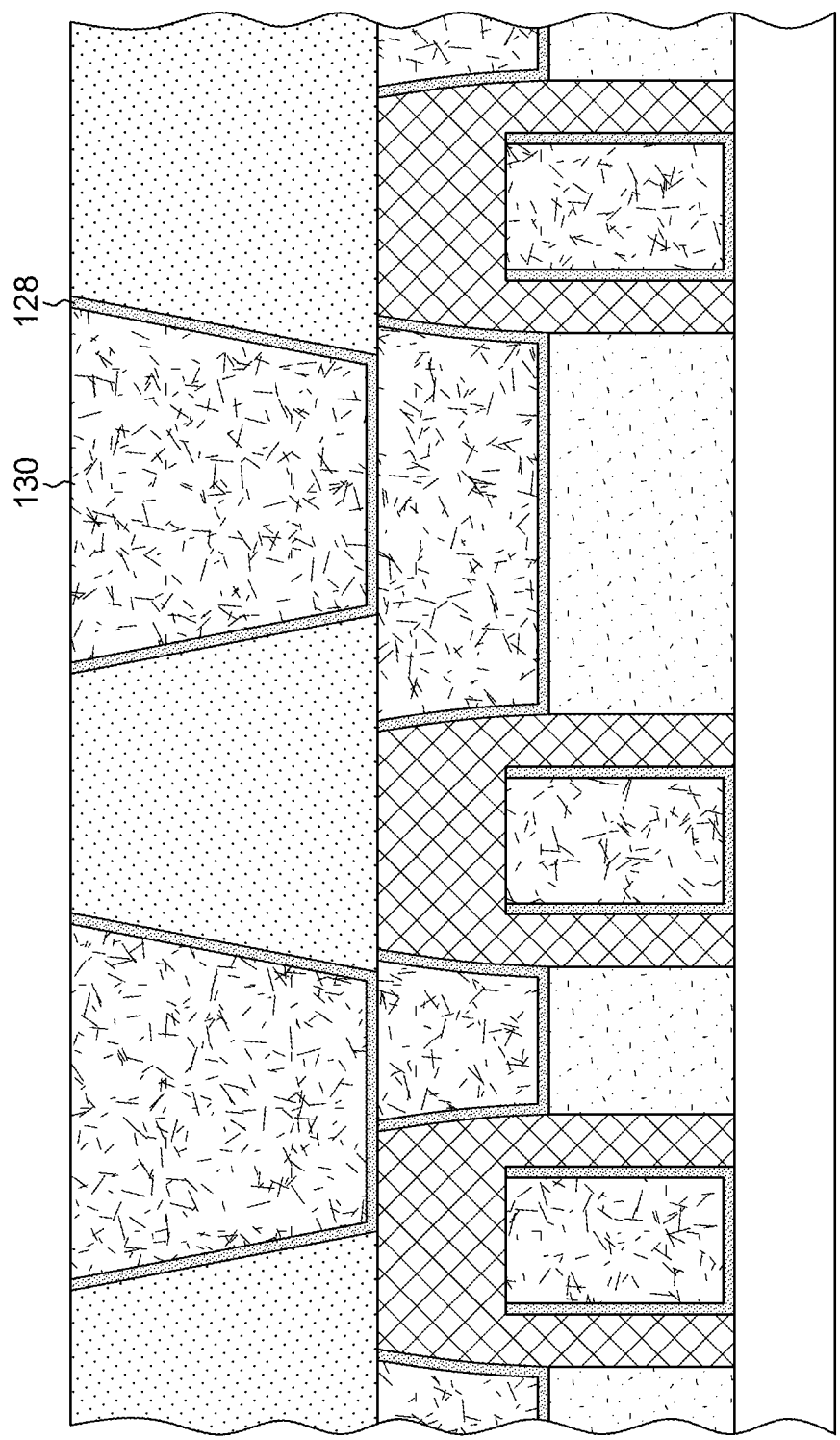
FIG. 9 depicts one example of the structure of FIG. 8 after forming contact liner(s) in the upper contact trench (openings) and filling the lined trench (openings) with a conductive material (e.g., tungsten), in accordance with one or more aspects of the present invention. Although not shown in FIG. 9, due to the location of the cross-section, one skilled in the art will understand that contacts to the gate structures are also fabricated.

FIG. 9 depicts one example of the structure of FIG. 8 after forming contact liner(s) (e.g., contact liner 128) in the upper contact openings. In one example, the liner(s) may include, for example, titanium nitride or other liner material (e.g., titanium or cobalt or combinations thereof), and may be formed, for example, using conventional processes and techniques. The lined openings are then filled with one or more conductive materials 130 (e.g., tungsten), which may be followed by planarization, in accordance with one or more aspects of the present invention. Although not shown in FIG. 9, due to the location of the cross-section, one skilled in the art will understand that contacts to the gate structures are also fabricated.

In a first aspect, disclosed above is a method. The method includes providing a semiconductor structure, the semiconductor structure including a semiconductor substrate, fin(s) on the substrate, at least one fin of the fin(s) including a source, a drain, and a channel situated between the source and the drain. The method further includes forming a gate structure having a gate electrode surrounding the channel, and a thick gate cap on top of the gate electrode, and two spacers adjacent to sidewalls of the gate electrode and the thick gate cap, forming lower contacts over the source and the drain adjacent to the gate structures, and forming upper contacts for the source and the drain over at least part of the respective lower contacts.

In one example, the semiconductor structure provided may further include a gate liner for the gate electrode, a fin liner above the at least one fin of the fin(s), a dielectric layer above the fin liner, and a conductive gate surrounding the channel, the conductive gate being exposed at a top surface thereof. In one example, forming the gate structure may include, for example, recessing the top surface of the conductive gate of the at least one fin of the fin(s), the recessing forming a gate opening above a remaining portion of the conductive gate, and forming the thick gate cap in the gate opening. In one example, the method may further include, for example, planarizing the semiconductor structure down to the thick gate cap by removing material over the thick gate cap, the planarizing exposing portion of the dielectric layer, and removing exposed portions of the dielectric layer. In one example, the method may further include, for example, removing the fin liner, the removing of the fin liner exposing the source and drain of the at least one fin of the fin(s).

In one example, forming the lower contacts may include, for example, forming a conformal contact liner over the structure after removing the fin liner, forming a blanket conductive layer of conductive material(s), and planarizing the structure down to the gate cap thereby creating the lower contacts. In one example, forming the upper source and drain contacts may include, for example, forming a blanket dielectric layer over the structure after planarizing down to the gate cap creating the lower contacts, removing portions of the blanket dielectric layer, the removing of portions of the blanket dielectric layer exposing at least part of the lower contact and forming upper contact openings, and forming the upper source and drain contacts in the upper contact openings. In one example, the method may further include, for example, prior to forming the upper contacts, lining the upper contact openings with a contact liner.

In a second aspect, disclosed above is a method of forming FinFET(s). The method includes forming a gate structure, the gate structure surrounding a channel of the FinFET(s), the gate structure including a conductive gate electrode, spacers adjacent to sidewalls of the metal gate electrode, and a thick gate cap having a thickness of between about 30 nm and about 50 nm. The method further includes forming a source and a drain, the channel being situated between the source and the drain, and forming two-part conductive contacts for the source and the drain, each of the conductive contacts having a bottom part adjacent the thick gate cap and a top part above and in at least partial contact with the bottom part. A combination of the thick gate cap and the two-part source and drain contacts prevent electrical shorts between the conductive gate electrode and the source and the drain.

In one example, the FinFET(s) may further include, for example, a semiconductor substrate, and fin(s) on the semiconductor substrate, the fin(s) being integral with the source(s), the drain(s) and the channel(s).

In one example, forming the gate structure(s) in the method of the second aspect may include, for example, recessing the conductive gate electrode, the recessing forming a gate opening, and forming the thick gate cap in the gate opening.

In one example, a top surface of the bottom part of the two-part conductive contacts formed in the method of the second aspect may be, for example, coplanar with a top surface of the thick gate cap. In one example, forming the two-part conductive contacts includes, for example, forming a dielectric layer with openings that expose at least a portion of the bottom part of the two-part conductive contacts, the top part being in contact with the at least a portion of the bottom part.

In one example, the FinFET(s) formed in the method of the second aspect may further include, for example, liners for the conductive gate electrode(s) and the two-part conductive contacts.

In a third aspect, disclosed above is a semiconductor structure. The semiconductor structure includes a semiconductor substrate, fin(s) on the semiconductor substrate, conductive gate(s) surrounding a portion of the fin(s), pair(s) of spacers along sidewalls of the conductive gate(s), gate cap(s) on the conductive gate(s), source(s) and drain(s) adjacent each of the pair(s) of spacers, respectively. The semiconductor structure further includes lower contact(s) above the source(s) and the drain(s), and upper contact(s) above at least part of the source(s) and the drain(s).

In one example, the semiconductor structure may further include, for example, a liner for the conductive gate(s).

In one example, the semiconductor structure of the second aspect may further include, for example, a liner for the at least one lower contact.

In one example, the semiconductor structure of the second aspect may further include, for example, a liner for the at least one upper contact.

In one example, the conductive gate(s) of the semiconductor structure of the second aspect may include, for example, conductive metal(s).

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing a semiconductor structure, the semiconductor structure comprising a semiconductor substrate, one or more fins on the substrate, at least one fin of the one or more fins comprising a source, a drain, and a channel situated between the source and the drain, wherein the semiconductor structure further comprises:
      a gate liner for the gate electrode;
      a fin liner above the at least one fin of the one or more fins;
      a dielectric layer above the fin liner; and
      a conductive gate surrounding the channel, wherein the conductive gate is exposed at a top surface thereof;
   forming a gate structure having a gate electrode surrounding the channel and a thick gate cap on top of the gate electrode, and two spacers adjacent to sidewalls of the gate electrode and the thick gate cap, wherein forming the gate structure comprises:
      recessing the top surface of the conductive gate of the at least one fin of the one or more fins, the recessing forming a gate opening above a remaining portion of the conductive gate; and
      forming the thick gate cap in the gate opening;
   forming lower contacts over the source and the drain adjacent to the gate structure, wherein forming the lower contacts comprises:
      forming a conformal contact liner over the structure after removing the fin liner;
      forming a blanket conductive layer of one or more conductive materials; and
      planarizing the structure down to the gate cap thereby creating the lower contacts;
   forming upper contacts for the source and the drain over at least part of the respective lower contacts;
   planarizing the semiconductor structure down to the thick gate cap by removing material over the thick gate cap, wherein the planarizing exposes portions of the dielectric layer;
   removing exposed portions of the dielectric layer; and
   removing the fin liner, wherein removing the fin liner exposes the source and drain of the at least one fin of the one or more fins.

2. The method of claim 1, wherein forming the upper source and drain contacts comprises:
   forming a blanket dielectric layer over the structure after planarizing down to the gate cap creating the lower contacts;
   removing portions of the blanket dielectric layer, wherein removing portions of the blanket dielectric layer exposes at least part of the lower contact and forms upper contact openings; and
   forming the upper source and drain contacts in the upper contact openings.

3. The method of claim 2, further comprising, prior to forming the upper contacts, lining the upper contact openings with a contact liner.

* * * * *